US005587550A

United States Patent [19]

Willis et al.

[11] Patent Number: 5,587,550

[45] Date of Patent: Dec. 24, 1996

[54] INTERNALLY TIMED, MULTI-OUTPUT IMPULSE CARTRIDGE

[75] Inventors: Kenneth E. Willis, Redwood City; William D. Fahey, Cupertino; David S. Whang, San Jose, all of Calif.

[73] Assignee: Quantic Industries, Inc., San Carlos, Calif.

[21] Appl. No.: 409,258

[22] Filed: Mar. 23, 1995

[51] Int. Cl.$^6$ .................... F23Q 7/00

[52] U.S. Cl. .................... 102/217; 102/220; 102/218

[58] Field of Search .................... 102/220, 218, 102/217, 216, 505

[56] References Cited

U.S. PATENT DOCUMENTS

| | | | |
|---|---|---|---|
| 3,225,695 | 12/1965 | Kapp et al. | 102/220 |
| 3,604,356 | 9/1971 | Browning, Jr. | 102/216 |
| 4,033,266 | 7/1977 | Ziemba | 102/216 |
| 4,136,617 | 1/1979 | Fowler | 102/220 |
| 4,183,302 | 1/1980 | Schillreff | 102/89 |
| 4,227,461 | 10/1980 | Beezley et al. | 102/218 |
| 4,313,379 | 2/1982 | Wallace | 102/217 |
| 4,325,304 | 4/1982 | Ormiston | 102/200 |
| 4,406,227 | 9/1983 | Beeker et al. | 102/505 |
| 4,409,897 | 10/1983 | Kirby et al. | 102/200 |
| 4,577,561 | 3/1986 | Perry | 102/215 |
| 4,586,437 | 5/1986 | Miki et al. | 102/220 |
| 4,724,765 | 2/1988 | Evrard et al. | 102/248 |
| 4,730,558 | 3/1988 | Florin et al. | 102/218 |
| 4,823,701 | 4/1989 | Wilhelm | 102/492 |
| 4,825,765 | 5/1989 | Ochi et al. | 102/206 |
| 4,827,844 | 5/1989 | Miller | 102/220 |
| 4,843,964 | 7/1989 | Bickes, Jr. et al. | 102/202.5 |
| 4,893,564 | 1/1990 | Ochi et al. | 102/218 |
| 4,984,519 | 1/1991 | Ochi et al. | 102/217 |
| 4,993,322 | 2/1991 | Boucard Jean | 102/218 |
| 5,031,537 | 7/1991 | Taylor | 102/218 |
| 5,094,167 | 3/1992 | Hendley, Jr. | 102/218 |
| 5,295,438 | 3/1994 | Hill et al. | 102/217 |

*Primary Examiner*—Michael J. Carone
*Assistant Examiner*—Christopher K. Montgomery
*Attorney, Agent, or Firm*—Wilson Sonsini Goodrich & Rosati

[57] ABSTRACT

This invention relates to a circuit and method for generating sequential, multiple impulses for use in firing or initiating more than one output device. The invention permits the firing, or actuation, of multiple devices at different times. The disclosed invention is an improvement on existing designs for multiple output impulse cartridges. This multi-output impulse cartridge has self-contained an electrical circuit and electrical energy storage capacitors which allow a single, short pulse of input current to initiate a first output, time out a second or multiple later outputs, and fire the outputs from the remaining energy stored on the capacitors.

14 Claims, 1 Drawing Sheet

INTERNALLY TIMED, MULTI-OUTPUT IMPULSE CARTRIDGE

BACKGROUND OF THE INVENTION

The present invention relates to circuits and methods for generating sequential, multiple electrical impulses to actuate, fire or initiate a plurality of output devices. The invention permits the actuating, firing, and initiating of the multiple output devices at predetermined times.

A variety of single use mechanical devices are actuated by pyrotechnic loaded cartridges. These types of cartridges are called impulse cartridges since they provide a single impulse of work to actuate the device. Examples of these impulse actuated devices include cable cutters, piston actuators, vehicle safety systems, and military aircraft countermeasure devices having release systems and launchers which dispense chaff and flare countermeasure devices to evade attacking missiles.

Many of these devices require a cartridge with a single output which is activated by a pulse of electrical current applied to the device through a conducting pair of wires. In some applications, the actuating device requires two or more pyrotechnic outputs which are time separated. These multi-output cartridges typically require a controller or timing device external to the cartridge, and multiple pairs of wires leading to the cartridge in order to initiate the events separately and with the proper time separation.

For example, U.S. Pat. No. 4,313,379 to Wallace, "Voltage-Coded Multiple Payload Cartridge" improved upon this arrangement for multi-output cartridges. This patent allows a second output to be fired through a single wire pair by using a voltage sensitive diode (a zener diode) to distinguish the first from the second electrical pulse, and directing the electrical energy first to the first output and next to the second. The timing function for this invention is performed in a separate device installed external to the impulse cartridge. The particular application this invention focused upon was the dispensing of countermeasures to protect aircraft from attacking missiles.

SUMMARY OF THE INVENTION

The present invention relates to multiple output electrical impulse cartridges. In one aspect of the present invention, the multiple output electrical impulse cartridge contains an electrical circuit and electrical energy storage capacitors which allow a single, short pulse of input current to initiate a first output, time out a second or multiple later outputs, and fire these outputs from the remaining energy stored on the capacitors. Thus, it is an advantage of the present invention that the benefit of time separated outputs is achieved without adding complexity to the control unit or the wiring which would be used for a single output device. An immediate application for this invention is in the aircraft countermeasure field; the effectiveness of chaff cartridges can be essentially doubled by using a dual output chaff cartridge which in turn requires a dual output impulse cartridge for its activation.

It is another advantage of the invention that the implementation can be achieved within the volume of existing dispensers and can operate with the current pulse provided by existing dispensers. This allows the benefits of multiple, timed outputs to be achieved without modifying or replacing existing dispensers.

DESCRIPTION OF THE PREFERRED EMBODIMENT

Figure 1:
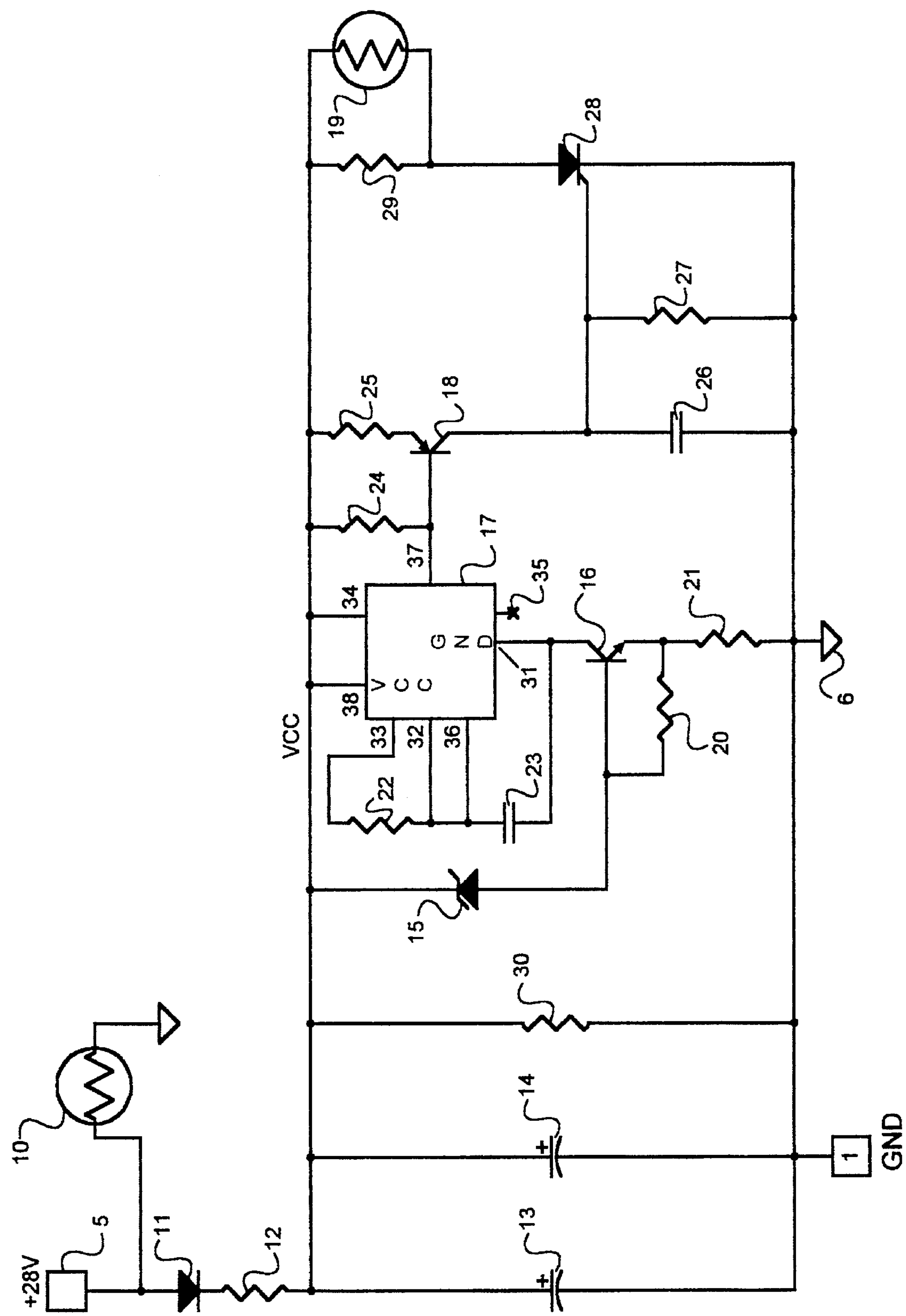
FIG. 1 is an electrical schematic of an embodiment of a circuit of the present invention.

In the preferred embodiment, the multiple output electrical impulse cartridge includes an electrical circuit and at least one capacitor, and preferably a capacitor network, which will allow a single, short impulse of input current to actuate a first output device, then time out second or multiple later outputs, and actuate the latter output devices from the remaining energy stored in the capacitor(s). For example, a single 30 millisecond impulse of 22 volts and 4 amperes can actuate or fire two, three or more output devices with a precise time interval between the output devices.

The schematic diagram which implements the circuit for the preferred embodiment of this invention is shown in FIG. 1. When the initial firing pulse of electricity is applied between the +28 volts node 5 and ground node 6, the first ordnance device, a hot wire initiator 10 draws the bulk of the current and fires the first electroexplosive device within 1–3 milliseconds after application. Once the hot wire initiator bridge 10 opens, the current input charges the two capacitors 13 and 14 through diode 11 and resistor 12. When the voltage across the capacitors 13, 14 reaches a predetermined level determined by the zener diode 15, transistor 16 turns on the timing circuit 17. In other words, zener diode 15 biases the transistor 16 and starts the timing circuit 17 when the voltage across the capacitors 13, 14 reaches a threshold determined by the zener diode 15. In the preferred embodiment, timing circuit 17 can be a CMOS version of a standard "555"-type timer, such as an ICM7555 available from Harris Corp. FIG. 1 illustrates an embodiment where the timing circuit 17 has standard inputs and outputs 31 (ground), 32 (TR), 33 (Q), 34 (R), 35 (not connected), 36 (THR), 37 (DIS), and 38 (VCC).

Once the timer 17 times out for the desired time delay between outputs, the output 37 goes high and turns on the switch (transistor) 18, which in turn triggers SCR 28, thereby dumping the energy stored in capacitors 13 and 14 into the second ordnance device, a SCB (semiconductor bridge) 19. The second SCB 19 (and any subsequent initiator or device) is preferably of the semiconductor bridge variety because it can be fired from a small (20–40 microfarad) capacitor which can be charged by the available current from a single fire impulse. The first initiator 10 can be either a hot wire or semiconductor bridge variety. The first initiator can be fired directly, as shown, or by a transistor and/or SCR circuit. The storage capacitors 13 and 14 also provide the energy to operate the delay electronics after the input pulse ends.

Additional electronic components of the circuit include the following. Resistors 20 and 21 are used to bias transistor 16. Resistor 22 and capacitor 23 are used to determine the time delay to fire the second device. Resistors 24 and 25 are used to bias transistor 18. Transistor 18 acts as a switch, after the delay has elapsed, to turn on the silicon controlled rectifier (SCR) 28. SCR 28 connects the capacitors 13, 14 to the semiconductor bridge 19. Resistor 27 is used to provide a passive low impedance from gate to cathode of the SCR 28 that prevents spontaneous triggering. Resistor 27 also provides a load for the transistor 18. Capacitor 26 is used to cancel the significant gate-to-anode capacitance of the SCR 28 to prevent self-triggering when voltage is applied. Resistor 29 provides holding current for the SCR 28 after the SCB 19 has gone to an open state or during test when the SCB is not present. Resistor 30 is a bleed resistor which is safety related; if charge accumulates on the capacitors 13, 14 due to spurious RF energy, it dissipates and cannot activate the device.

The circuit described in FIG. 1 can be implemented with surface mount components, and can be constructed on a single circuit board which is preferably less than 0.75 inches in diameter. The relatively small size is preferred so that the circuit can be mounted within the envelope of existing casings of multi-output impulse cartridges such as the BBU-48B made by Tracor. This permits existing single output dispenser equipment to be used for multi-output functions without modification.

If more than two outputs are required, it is evident that multiple delays, capacitors and switches can be added for each timed output desired.

In a preferred embodiment, values for the various components can be as follows. Diode 11 is an CMPD914, similar to a 1N914 diode in an SOT-23 package, available from Central Semiconductor and other vendors. Resistor 12 is 22 ohms. Capacitors 13 and 14 are each 22 microfarads, rated at 35 volts, and can be tantalum capacitors. Zener diode 15 is a BZX84C10L, rated at 10 volts, available from Motorola. Transistor 16 is a MMBT2222, equivalent to a 2N2222 NPN transistor, available from Motorola. Transistor 18 is an MMBT2907, equivalent to a 2N2907 PNP transistor, available from Motorola. Resistor 20 is 33 kilohms. Resistor 21 is 10 kilohms. Resistor 22 is 4.75 megohms. Capacitor 23 is 15 nanofarads, rated at 100 volts. Resistor 24 is 100 kilohms. Resistor 25 is 5.6 kilohms. Capacitor 26 is 100 picofarads, rated at 100 volts. Resistor 27 is 3.3 kilohms. Silicon controlled rectifier 28 is a CMPS5064, equivalent to a 2N5064, available from Central Semiconductor. Resistor 29 is 270 ohms. Resistor 30 is 330 kilohms. All of the resistors and capacitors have 10 percent tolerance values, except for resistor 22, which preferably has a one percent tolerance value. All of the resistors are rated at 0.1 watts except resistor 12, which is rated at 0.5 watts.

One feature of the preferred embodiment is the use of a low energy, safe impulse cartridge for the second and subsequent events. The low energy requirement is driven by the small space in which the electronics must be packaged, thereby requiring small capacitors for the storage mechanism to fire the second or subsequent cartridges. The energy available is also limited by the voltage, current and duration of the single firing impulse. In the preferred embodiment, the initiator of choice for this application uses a silicon plasma as the ignition mechanism. These "semiconductor" bridges can be of several varieties, including those described in the following patents:

| | | |
|---|---|---|
| 3,366,055 | 1/1968 | Hollander, Jr. |
| 4,708,060 | 11/1987 | Bickes et al. |
| 4,976,200 | 12/1990 | Benson et al. |
| 5,085,146 | 2/1992 | Baginski |

Other semiconductor bridge structures are shown in co-pending U.S. patent application Ser. No. 08/170,658, which is assigned to the assignee of the present invention, and which is incorporated herein by this reference. For impulse cartridge applications, the Baginski technology may be preferable due to the relative immunity to RF radiation which can cause the cartridge to explode prematurely. However, any of the described technologies is adequate.

The invention now being fully described, it will be apparent to one of ordinary skill in the art that many changes and modifications can be made thereto without departing from the spirit or scope of the appended claims.

What is claimed:

1. A method for generating sequentially timed, multiple explosive output charges, comprising:

(a) applying a single input pulse of electrical current to an input terminal;

(b) using current from the single input pulse to actuate a first output initiator device and fire a first explosive device;

(c) after the first output initiator device has actuated, using current from the single input pulse to charge a capacitor to a predetermined voltage level;

(d) measuring a delay after the firing of the first output initiator device using a timing circuit responsive to the voltage level; and (e) after the end of the delay, discharging the capacitor through a second output initiator device to actuate the second output initiator device and fire a second explosive device.

2. The method of claim 1, wherein the second output initiator device comprises a semiconductor bridge initiator.

3. The method of claim 1 or 2, wherein the capacitor further comprises a parallel network of capacitors.

4. The method of claim 3, wherein the parallel network of capacitors includes capacitors having a value in the range of about 10 to 500 microfarads.

5. The method of claim 1, wherein step (e) further includes the steps of using a switch to activate a silicon controlled rectifier, and using the silicon controlled rectifier to discharge the capacitor through the second output initiator device.

6. The method of claim 5, wherein the second output initiator device comprises a semiconductor bridge initiator.

7. The method of claim 5 or 6, wherein the capacitor further comprises a parallel network of capacitors.

8. The method of claim 7, wherein the parallel network of capacitors includes capacitors having a value in the range of about 10 to 500 microfarads.

9. A circuit for use in generating sequentially timed, multiple explosive output charges, comprising:

(a) a first output initiator device and a second output initiator device, each adapted to receive output impulses and each adapted to fire an explosive device;

(b) an input terminal adapted to receive a single input impulse of electrical current;

(c) the first output initiator device connected to the input terminal, wherein the first output initiator device initially draws the majority of the current from the single input impulse until the first output initiator device fires an explosive device;

(d) a capacitor network connected to the input terminal, wherein the capacitor network is charged to a given voltage level by the single input impulse after the first output initiator device has fired;

(e) a timing circuit connected to the capacitor network and responsive to the voltage level for measuring a delay after the firing of the first output initiator device; and (f) output circuit means for discharging the capacitor network through a second output initiator device in response to the end of the delay measured by the timing circuit.

10. The circuit of claim 9, wherein the second output initiator device comprises a semiconductor bridge initiator.

11. The circuit of claim 9 or 10, wherein the capacitor network includes capacitors having a value in the range of about 10 to 500 microfarads.

12. The circuit of claim 9, wherein the output circuit means further includes a switch to activate a silicon controlled rectifier, wherein the silicon controlled rectifier discharges the capacitor network through the second output initiator device.

13. The circuit of claim 12, wherein the second output initiator device comprises a semiconductor bridge initiator.

14. The circuit of claim 12 or 13, wherein the capacitor network includes capacitors having a value in the range of about 10 to 500 microfarads.

* * * * *